United States Patent
Hafuka

(10) Patent No.: US 10,594,282 B2
(45) Date of Patent: Mar. 17, 2020

(54) AUTOMATIC GAIN CONTROL (AGC) CIRCUIT, DESPREADING CIRCUIT, AND METHOD FOR REPRODUCING RECEPTION DATA

(71) Applicant: LAPIS Semiconductor Co., Ltd., Yokohama (JP)

(72) Inventor: Takamitsu Hafuka, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 5 days.

(21) Appl. No.: 15/881,696

(22) Filed: Jan. 26, 2018

(65) Prior Publication Data

US 2018/0219520 A1    Aug. 2, 2018

(30) Foreign Application Priority Data

Jan. 27, 2017  (JP) ................. 2017-013354

(51) Int. Cl.
| | |
|---|---|
| *H03G 3/30* | (2006.01) |
| *H04B 1/69* | (2011.01) |
| *H04B 1/16* | (2006.01) |
| *H04B 1/7073* | (2011.01) |

(52) U.S. Cl.
CPC ......... *H03G 3/3042* (2013.01); *H03G 3/3052* (2013.01); *H03G 3/3078* (2013.01); *H04B 1/16* (2013.01); *H04B 1/69* (2013.01); *H04B 1/7073* (2013.01)

(58) Field of Classification Search
None
See application file for complete search history.

(56) References Cited

U.S. PATENT DOCUMENTS

| | | | | |
|---|---|---|---|---|
| 3,706,929 A | * | 12/1972 | Robinson | H04B 1/66 375/216 |
| 4,032,847 A | * | 6/1977 | Unkauf | H04B 7/005 375/348 |
| 5,289,501 A | * | 2/1994 | Seshadri | H03M 13/25 375/254 |
| 5,533,046 A | * | 7/1996 | Lund | H04B 1/69 375/130 |

(Continued)

FOREIGN PATENT DOCUMENTS

| | | | |
|---|---|---|---|
| JP | 06244820 A | * | 9/1994 |
| JP | 11088232 A | * | 3/1999 |

(Continued)

*Primary Examiner* — Berhanu Tadese
(74) *Attorney, Agent, or Firm* — Rabin & Berdo, P.C.

(57) ABSTRACT

An automatic gain control circuit controls a gain of a wireless receiver in accordance with an amplitude of a reception signal. The automatic gain control circuit includes a reference level calculator, a register, a reference level adjuster, and a bit width conversion circuit. The reference level calculator calculates a reference level on the basis of the amplitude of the reception signal. The register stores an adjustment value. The reference level adjuster adjusts the reference level on the basis of the adjustment value stored in the register. The bit width conversion circuit performs a bit width conversion for the entire amplitude direction by changing a bit pitch for determining discrete data values of the reception signal, on the basis of the adjusted reference level.

8 Claims, 7 Drawing Sheets

(56) References Cited

U.S. PATENT DOCUMENTS

| | | | | | |
|---|---|---|---|---|---|
| 5,563,907 | A | * | 10/1996 | Lomp | H03G 3/3042 375/142 |
| 5,745,531 | A | * | 4/1998 | Sawahashi | H04B 1/1027 375/345 |
| 5,896,423 | A | * | 4/1999 | Okamoto | H03G 3/001 375/150 |
| 6,107,879 | A | * | 8/2000 | Hoshino | H03G 3/30 330/124 R |
| 6,121,828 | A | * | 9/2000 | Sasaki | H03D 3/007 329/304 |
| 6,160,838 | A | * | 12/2000 | Shinohara | H04B 1/707 375/130 |
| 6,301,294 | B1 | * | 10/2001 | Hara | H04B 1/7075 375/150 |
| 6,580,748 | B1 | * | 6/2003 | Muraoka | H04B 1/707 375/141 |
| 6,683,493 | B1 | * | 1/2004 | Fujimora | H04L 7/04 329/304 |
| 6,694,129 | B2 | * | 2/2004 | Peterzell | H03D 3/008 455/208 |
| 6,707,492 | B1 | * | 3/2004 | Itani | H03M 1/187 341/139 |
| 6,985,514 | B2 | * | 1/2006 | Zalio | H03G 3/3089 327/164 |
| 7,386,285 | B2 | * | 6/2008 | Yamauchi | H03M 1/185 455/127.2 |
| 7,391,452 | B2 | * | 6/2008 | Itani | H03M 1/187 341/139 |
| 7,555,067 | B2 | * | 6/2009 | Jeong | H04B 1/707 375/340 |
| 7,636,219 | B2 | * | 12/2009 | Ikegami | G11B 5/0083 360/26 |
| 8,145,165 | B1 | * | 3/2012 | Su | H03G 3/3052 455/232.1 |
| 8,422,971 | B2 | * | 4/2013 | Su | H03G 3/3052 455/232.1 |
| 8,830,917 | B1 | * | 9/2014 | Zhang | H04W 4/00 370/329 |
| 8,891,592 | B1 | * | 11/2014 | Zhang | H04W 56/00 375/149 |
| 9,735,749 | B2 | * | 8/2017 | Pei | H04B 17/26 |
| 9,807,718 | B2 | * | 10/2017 | Axmon | H04W 56/0015 |
| 2002/0123319 | A1 | * | 9/2002 | Peterzell | H04B 1/109 455/296 |
| 2002/0132597 | A1 | * | 9/2002 | Peterzell | H03D 3/008 455/130 |
| 2003/0207675 | A1 | * | 11/2003 | Hughes | H03G 3/3068 455/234.1 |
| 2004/0179118 | A1 | * | 9/2004 | Itani | H03M 1/187 348/255 |
| 2004/0179583 | A1 | * | 9/2004 | Jeong | H04B 1/707 375/147 |
| 2005/0213689 | A1 | * | 9/2005 | Matsuda | H04L 25/022 375/324 |
| 2006/0077080 | A1 | * | 4/2006 | Yamauchi | H03M 1/185 341/114 |
| 2006/0274819 | A1 | * | 12/2006 | Bengtsson | H03G 3/3052 375/147 |
| 2007/0047630 | A1 | * | 3/2007 | Yamauchi | H04B 1/7077 375/150 |
| 2007/0242378 | A1 | * | 10/2007 | Ikegami | G11B 5/0083 360/39 |
| 2007/0288666 | A1 | * | 12/2007 | Sheng | H04B 1/707 710/64 |
| 2007/0291879 | A1 | * | 12/2007 | Yamazaki | H03K 5/082 375/324 |
| 2010/0231435 | A1 | * | 9/2010 | Zhen | G01S 13/765 342/47 |
| 2011/0228816 | A1 | * | 9/2011 | Lomp | H03G 3/3042 375/130 |
| 2012/0149320 | A1 | * | 6/2012 | Su | H03G 3/3052 455/226.2 |
| 2016/0073370 | A1 | * | 3/2016 | Axmon | H04W 56/0015 370/350 |
| 2016/0150489 | A1 | * | 5/2016 | Pei | H04B 17/26 375/345 |
| 2018/0219520 | A1 | * | 8/2018 | Hafuka | H04B 1/7073 |

FOREIGN PATENT DOCUMENTS

| | | | | |
|---|---|---|---|---|
| JP | H11-88232 | A | | 3/1999 |
| JP | 2001044964 | A | * | 2/2001 ........... H03G 3/3078 |
| JP | 2004194355 | A | * | 7/2004 |
| JP | 2007295111 | A | * | 11/2007 ........... H03M 1/185 |
| JP | 2007295111 | A | * | 11/2007 ........... H03G 3/3068 |
| JP | 2009-232235 | A | | 10/2009 |
| JP | 2009232235 | A | * | 10/2009 |
| JP | 2009232235 | A | * | 10/2009 |
| JP | 2015154306 | A | * | 8/2015 ........ G01R 19/16528 |
| JP | 2015154306 | A | * | 8/2015 ........ G01R 9/16528 |

* cited by examiner

AUTOMATIC GAIN CONTROL (AGC) CIRCUIT, DESPREADING CIRCUIT, AND METHOD FOR REPRODUCING RECEPTION DATA

BACKGROUND OF THE INVENTION

1. Field of the Invention

The present invention relates to an automatic gain control (AGC) circuit used in a spread spectrum receiver, a despreading circuit having such an AGC circuit, and a method for reproducing reception data.

2. Description of the Related Art

A spread spectrum scheme is known as a communication scheme having high resistance to noise and interference. Spread spectrum receivers include an automatic gain control (AGC) circuit that controls the signal levels of input signals to correlators, with respect to varying reception levels.

For example, Patent Literature 1 (Japanese Patent Application Laid-Open No. H11-088232) discloses an automatic gain control (AGC) circuit and a spread spectrum receiver that can retrieve n-bit data from m-bit data (m>n) output from a correlator, on the basis of an effective number of bits, in order to reduce the bit width of a demodulator. Patent Literature 2 (Japanese Patent Application Laid-Open No. 2009-232235) discloses an automatic gain control (AGC) circuit in which the higher frequency the signal level of a modulation signal is clipped at, the more highly an amplification factor of an amplifier circuit is corrected.

SUMMARY OF THE INVENTION

In the above-described automatic gain control (AGC) circuits, the reduced bit width of the demodulator causes a reduction in the resolution of an output signal, thus degrading reception performance.

To solve the above problem, an object of the present invention is to provide an automatic gain control (AGC) circuit having a small quantization error and a high output signal resolution, and a despreading circuit and a method for reproducing reception data that provide high reception performance.

According to one aspect of the present invention, an automatic gain control circuit includes a reference level calculator configured to calculate a reference level on the basis of an amplitude of a reception signal; a register configured to store an adjustment value for the reference level; a reference level adjuster configured to adjust the reference level on the basis of the adjustment value stored in the resistor to generate an adjusted reference level; and a bit width conversion circuit configured to perform a bit width conversion to reduce the bit width of the reception signal on the basis of the adjusted reference level.

According to another aspect of the present invention, a despreading circuit includes the above-described automatic gain control circuit; a correlator configured to generate a correlation value signal representing a correlation value between a bit width converted signal whose bit width has been converted by the bit width conversion circuit and a spreading sequence; a comparison circuit configured to perform a comparison between the correlation value and a threshold value, to generate a comparison signal representing a comparison result; a synchronization control circuit configured to generate a synchronous signal on the basis of the comparison signal; a symbol timing generation circuit configured to generate a symbol timing signal representing a symbol timing and a reception clock on the basis of the synchronous signal and the comparison signal; and a data reproduction circuit configured to generate reception data on the basis of the correlation value signal and the symbol timing signal.

According to still another aspect of the present invention, a method for reproducing reception data includes the steps of calculating a reference level on the basis of the amplitude of a reception signal; holding a plurality of adjustment values for the reference level; receiving a synchronous signal of the reception signal; in an asynchronous state to the reception signal, selecting a first adjustment value from the adjustment values, and generating an adjusted reference level by subtracting the first adjustment value from the reference level; in a synchronous state to the reception signal in response to the synchronous signal, selecting a second adjustment value greater than the first adjustment value from the adjustment values, and generating an adjusted reference level by subtracting the second adjustment value from the reference level; performing a bit width conversion to reduce the bit width of the reception signal on the basis of the adjusted reference level, to generate a bit width converted signal; generating a correlation value signal representing a correlation value between the bit width converted signal and a spreading sequence; making a comparison between the correlation value and a threshold value, to generate a comparison signal representing a comparison result; generating a synchronous signal on the basis of the comparison signal; generating a symbol timing signal representing a symbol timing and a reception clock on the basis of the synchronous signal and the comparison signal; and generating the reception data on the basis of the correlation value signal and the symbol timing signal.

According to the present invention, it is possible to provide an automatic gain control (AGC) circuit having a small quantization error and a high output signal resolution. The AGC circuit can perform a bit width conversion with a high resolution, even in a signal non-receiving state. It is also possible to provide a despreading circuit and a method for reproducing reception data that prevent degradation in reception performance.

DETAILED DESCRIPTION OF THE INVENTION

Figure 1:
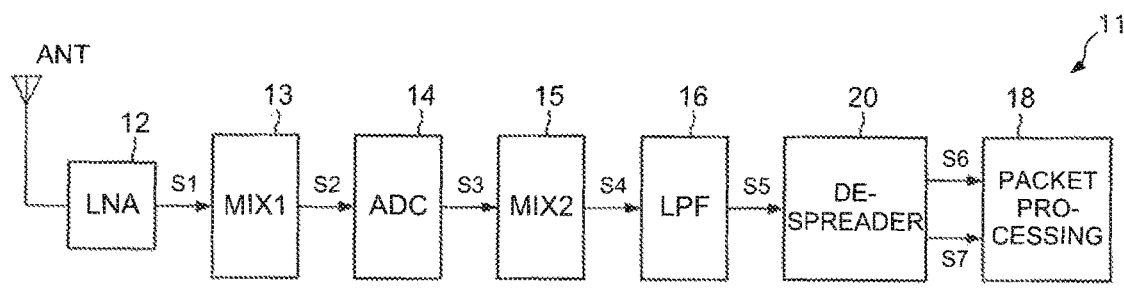
FIG. 1 is a block diagram showing an example of a configuration of a receiver 11 using a spread spectrum (SS) technology.

Embodiments of the present invention will be described below in detail with reference to the drawings, but the embodiments may be modified or combined in an appropriate manner. In the following description and the accompanying drawings, the same reference numerals indicate substantially the same or equivalent components.

[First Embodiment]

FIG. 1 is a block diagram showing an example of a configuration of a receiver 11 using a spread spectrum (SS) technology. The spread spectrum receiver 11 receives a transmission signal the spectrum of which is spread by, for example, direct sequence (DS) spreading.

A reception signal received by an antenna ANT of the spread spectrum receiver 11 is input to a low-noise amplifier circuit (LNA) 12. The LNA 12 amplifies the reception signal, and a mixer circuit (MIX1) 13 converts the frequency of the amplified reception signal S1 from a radio frequency (RF) into an intermediate frequency (IF).

A first analog-to-digital converter (ADC circuit) 14 applies an analog-to-digital conversion to the IF signal S2 after the frequency conversion, to digitize the IF signal S2. In the spread spectrum receiver 11, each signal may be processed as a signal constituting of an in-phase signal (I signal), a quadrature signal (Q signal), and the like.

The IF signal S3 digitized by the ADC circuit 14 is input to a second mixer circuit (MIX2) 15, and converted into a baseband signal S4. The baseband signal S4 is input to a low-pass filter (LPF) circuit 16, so that the LPF circuit 16 extracts only a signal component in a desired frequency channel.

The signal S5 extracted by the frequency limitation by the LPF circuit 16 is input to a despreading circuit (or despreader) 20. The despreading circuit 20 generates a correlation value between a spreading code sequence or spreading sequence (PN sequence) and the reception signal S5 after the frequency limitation, using a correlator, and performs a despreading process to decode the transmitted data on the basis of the correlation value. Reception data S6 and a reception clock S7 are generated by the despreading process, and input to a packet processing circuit 18, which performs detection of a synchronization word and extraction of user data.

Figure 2:
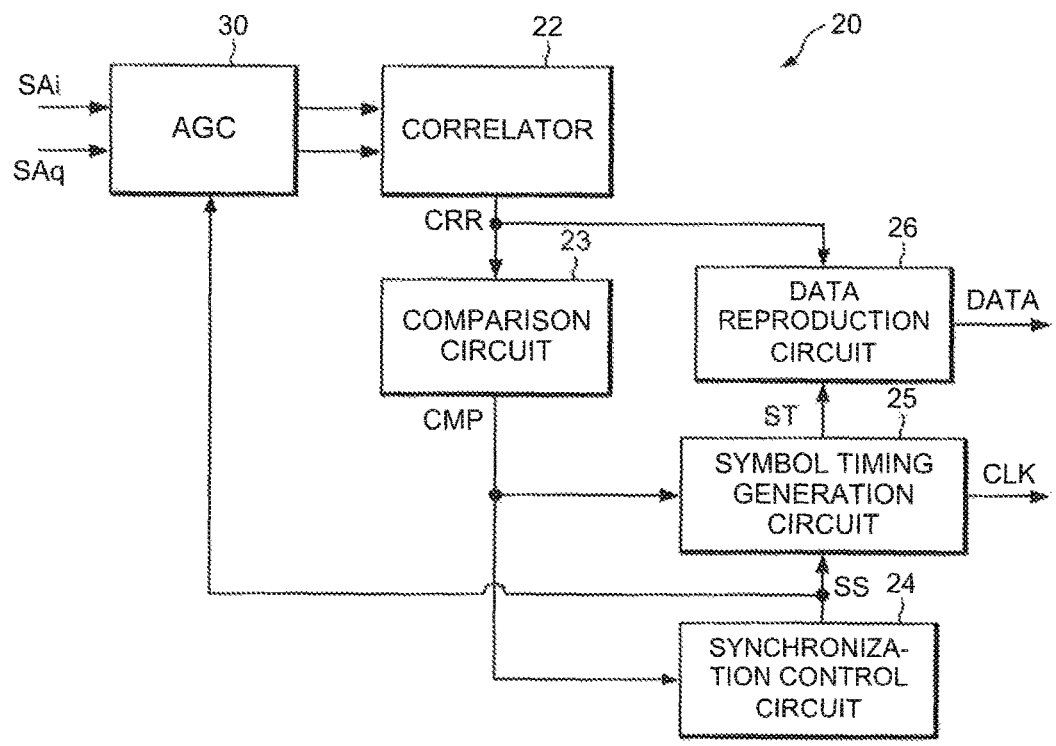
FIG. 2 is a block diagram showing an example of a configuration of a despreading circuit according to a first embodiment.

FIG. 2 is a block diagram showing an example of the configuration of the despreading circuit 20 according to a first embodiment. The despreading circuit 20 includes an automatic gain control (AGC) circuit 30, a correlator 22, a comparison circuit 23, a synchronization control circuit 24, a symbol timing generation circuit 25, and a data reproduction circuit 26.

A reception signal SA, i.e., the signal S5 input to the despreading circuit 20 is constituted of an in-phase signal (I signal) SAi and a quadrature signal (Q signal) SAq, and is subjected to gain control by the AGC circuit 30. After the gain control by the AGC circuit 30, the signal is supplied to the correlator 22. The correlator 22 generates a correlation value between the signal from the AGC circuit 30 and a spreading sequence (PN sequence).

The comparison circuit 23 compares the correlation value signal CRR from the correlator 22 with a threshold value, and generates a comparison signal CMP, which represents a comparison result. The comparison signal CMP from the comparison circuit 23 is supplied to the synchronization control circuit 24.

When the correlation value indicated by the correlation value signal CRR is equal to or greater than the threshold value, the synchronization control circuit 24 regards the situation as a synchronous state, and generates a synchronous signal SS (for example, a signal changing from an "L" level to an "H" level). The synchronous signal SS is supplied to the symbol timing generation circuit 25 and the AGC circuit 30.

The symbol timing generation circuit 25 generates a symbol timing signal ST indicating a symbol timing and a reception clock CLK on the basis of the synchronous signal SS from the synchronization control circuit 24 and the comparison signal CMP from the comparison circuit 23.

The data reproduction circuit 26 generates reception data DATA from the correlation value signal CRR from the correlator 22 and the symbol timing signal ST.

Figure 3:
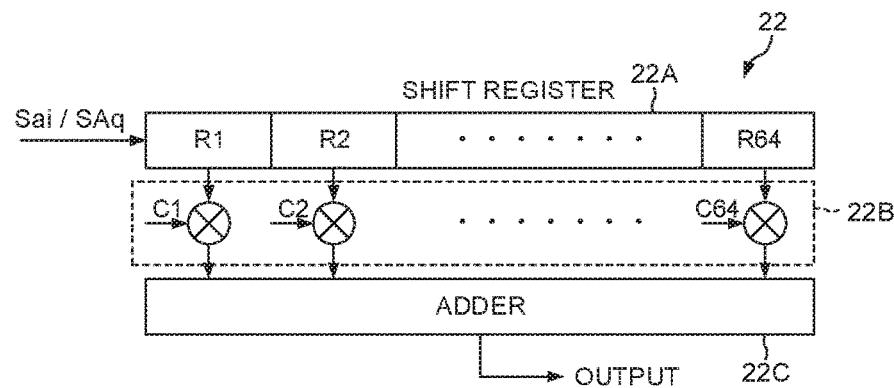
FIG. 3 is a block diagram showing an example of a circuit configuration of a correlator 22.

FIG. 3 is a block diagram showing an example of the circuit configuration of the correlator 22. A shift register 22A shifts the input data (SAi or SAq) in a chip rate period. Note that, the spreading sequence has 64 chips (C1 to C64) in this example, but the present invention is not limited thereto.

A multiplier 22B multiplies an output from each stage of the shift register 22A by each chip of the spreading sequence (C1, C2, . . . , C64). An adder 22C sums up the multiplication values from the multiplier 22B, and outputs the sum as the correlation value.

Figure 4:
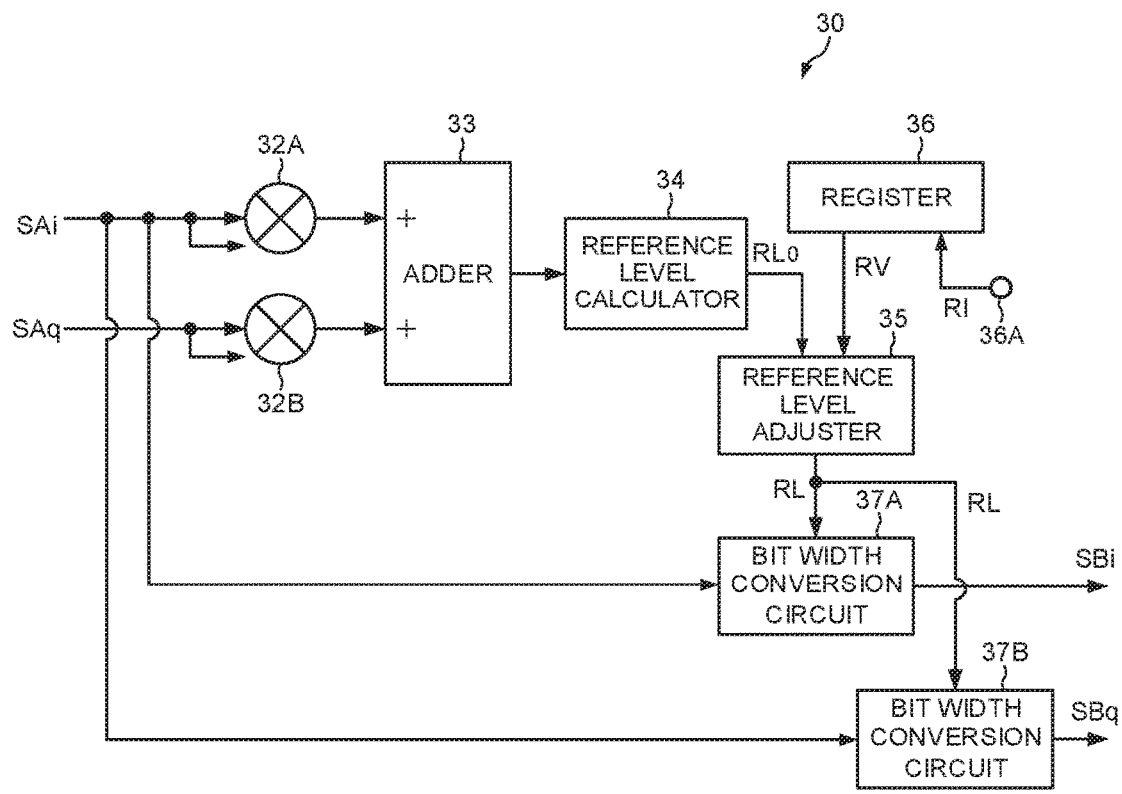
FIG. 4 is a block diagram showing an example of a configuration of an AGC circuit 30 according to the first embodiment.

FIG. 4 is a block diagram showing an example of the configuration of the AGC circuit 30 according to the first embodiment. Upon inputting a reception (incoming) signal SA (SAi and SAq) to the AGC circuit 30, the AGC circuit 30 converts the bit width (the number of data bits) of the reception signal SA to generate a signal SB (SBi and SBq), and outputs the signal SB.

To be more specific, the AGC circuit 30 converts the signals SAi and SAq each having an m-bit width input to the AGC circuit 30 into signals SBi and SBq each having an n-bit width (m>n) (in other words, reduces the bit width), and outputs the signals SBi and SBq. In the following description, the signals SAi and SAq each have a 10-bit width (m=10), and the signals SBi and SBq each have a 3-bit width. However, the bit widths are not limited thereto, and can take any number as long as m>n is satisfied.

More specifically, each of multipliers 32A and 32B calculates the square ($I^2$ or $Q^2$) of the amplitude (I or Q) of each input signal SAi or SAq, and supplies the result to an adder 33. The adder 33 sums up these values, and obtains a summation signal ($I^2+Q^2$).

A reference level calculator 34 calculates a bit width conversion reference level on the basis of the amplitudes of the reception signals. In this embodiment, a reference level RL0 is calculated on the basis of the summation value (I2+Q2) obtained by the adder 33. The reference level calculator 34 is constituted of, for example, a divider that divides the summation value (I2+Q2) by a predetermined fixed value (for example, 2m-1, 210-1=512 in this embodiment), to calculate the reference level RL0.

The reference level RL0 calculated by the reference level calculator 34 is supplied to a reference level adjuster 35. The reference level adjuster 35 performs an adjustment (correction) to the reference level RL0, so as to reduce the reference level RL0. More specifically, the reference level adjuster 35 is constituted of, for example, a subtractor that subtracts a level reduction value RV (fixed value), i.e., a setting value (adjustment value) stored in a register 36, from the reference level RL0, and generates an adjusted reference level RL.

The reference level adjuster 35 may be constituted of, for example, a divider or a multiplier that divides or multiplies the reference level RL0 by an output value (fixed value) RV from the register 36, to generate an adjusted reference level RL in which the reference level (reference level before adjustment) RL0 is reduced.

The register 36 may be configured to receive a register value designation signal RI through a register value designation signal terminal 36A provided therein, to change the output value RV on the basis of the register value designation signal RI. Thus, the reference level adjuster 35 may change the adjusted reference level RL on the basis of the output value RV from the register 36. The register 36 may be a memory that can store the value for reference level adjustment, such as a ROM (read only memory) or a RAM (random access memory).

The adjusted reference level RL calculated by the reference level adjuster 35 is supplied to a first bit width conversion circuit 37A and a second bit width conversion circuit 37B. The first bit width conversion circuit 37A and the second bit width conversion circuit 37B convert (i.e. down convert) the m-bit width signals SAi and SAq into the n-bit width signals SBi and SBq with respect to the adjusted reference level RL obtained by the reference level adjuster 35, and output the n-bit width signals SBi and SBq, respectively.

Figure 5A:
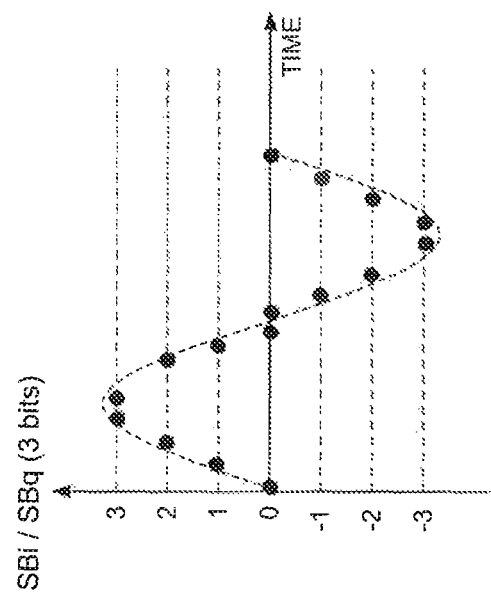
FIG. 5A is a graph that schematically shows a reference level RL0 calculated by a reference level calculator 34, and an adjusted reference level RL obtained by subtracting a level reduction value (RV), i.e., an output from a register 36 from the reference level RL0.

FIG. 5A is a graph that schematically shows the reference level RL0 calculated by the reference level calculator 34, and the adjusted reference level RL obtained by subtracting the level reduction value (RV), i.e., the output from the register 36 from the reference level RL0. Data values of the 10-bit width signal SAi or SAq are plotted as black dots (or filled circle), and a broken line (a sine wave signal in the drawing) schematically represents a signal corresponding to the signal SAi or SAq.

As shown in FIG. 5A, the positive and negative sides of the amplitude of the signal are divided with respect to the adjusted reference level RL into seven areas using 0.5 times, 1 time, and 1.5 times the adjusted reference level RL (−1.5×RL, −RL, −0.5×RL, 0.5×RL, RL, and 1.5×RL) as borders. The divided areas are converted into the values of −3, −2, −1, 0, 1, 2, and 3 in decimal notation (101, 110, 111, 000, 001, 010, and 011 in binary notation) by a bit width conversion.

In other words, the first bit width conversion circuit 37A and the second bit width conversion circuit 37B convert data values of the signals SAi and SAq into 3-bit width values (−3, −2, −1, 0, 1, 2, and 3 in decimal notation), respectively.

Figure 5B:
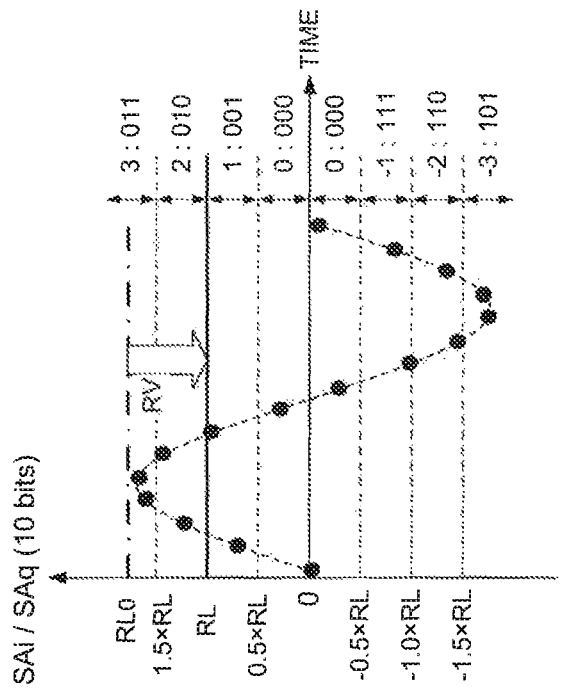
FIG. 5B is a graph that schematically shows data values of a signal SBi or SBq after being subjected to a bit width conversion with respect to the adjusted reference level RL.

FIG. 5B schematically shows the data values of the signal SBi or SBq, after being subjected to the bit width conversion with respect to the adjusted reference level RL. It is understood that the bit width conversion is performed with a high resolution.

Figure 6B:
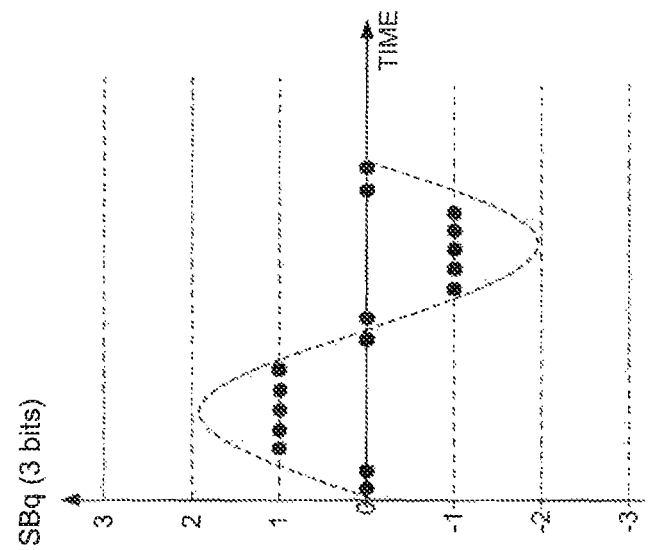
FIG. 6B is a graph that schematically shows data values of a signal SBi or SBq after being subjected to the bit width conversion, in the case of FIG. 6A.
Figure 6A:
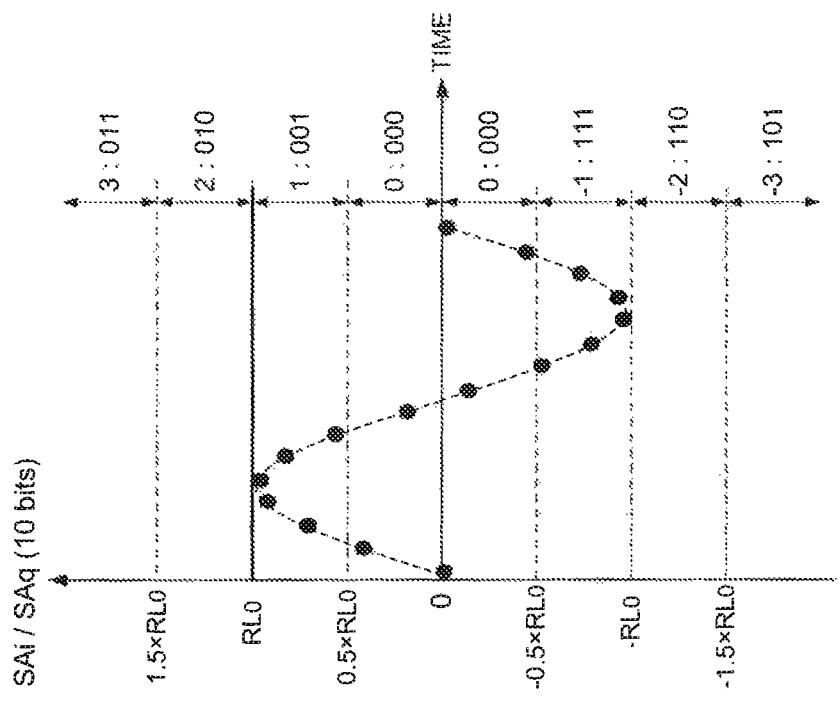
FIG. 6A is a graph that schematically shows a case of performing a bit width conversion with respect to the reference level RL0 before adjustment, as a comparative example of the first embodiment.

The resolution of the bit width conversion will be described below in more detail, with reference to FIGS. 6A and 6B showing a comparative example of this embodiment. FIG. 6A is a graph that schematically shows the case of performing a bit width conversion with respect to the reference level RL0 before the adjustment. FIG. 6A is different from FIGS. 5A and 5B in terms of using the reference level RL0 as the reference. In this case, seven areas (−3, −2, −1, 0, 1, 2, and 3 in decimal notation) of the amplitude of the signal each have wider widths (distances in an amplitude direction) than the seven areas divided with reference to the adjusted reference level RL.

FIG. 6B schematically shows data values of the signal SBi or SBq, after being subjected to the bit width conversion with reference to the reference level RL0 before the adjustment. Also referring to FIG. 6A, when the reference level RL0, which is a value before the adjustment by the reference level adjuster 35, is used as the reference, the resolution is reduced in the amplitude direction, and therefore a quantization error increases.

In a later stage than the correlator, the reception data and the reception clock are demodulated using the signal (SBi and SBq) represented in 3 bits. The reduction in the resolution in the amplitude direction, in other words, the increase in the quantization error in demodulation using the correlator causes an increase in the difference between the reception data and reference data (i.e. data with which the correlator detects a correlation of the reception signal), thus resulting in a reduction in a correlation value. When a reception level is lower, such as at a reception sensitivity point, the correlation value tends to be lower and does not exceed a correlation threshold value, and therefore cannot be correctly demodulated. This means a reduction in reception performance. Therefore, the reduction in the resolution of the signal after the bit width conversion causes degradation in the reception performance of the reception circuit in the later stage than the correlator.

According to the embodiment, since the bit width conversion is performed with reference to the adjusted (or corrected) reference level RL, the bit width conversion can be performed with the small quantization error and the high resolution. Since the AGC circuit supplies the reception data that has been subjected to the bit width conversion with the high resolution, it is possible to provide the despreading circuit that can perform demodulation with high accuracy.

[Second Embodiment]

Figure 7:
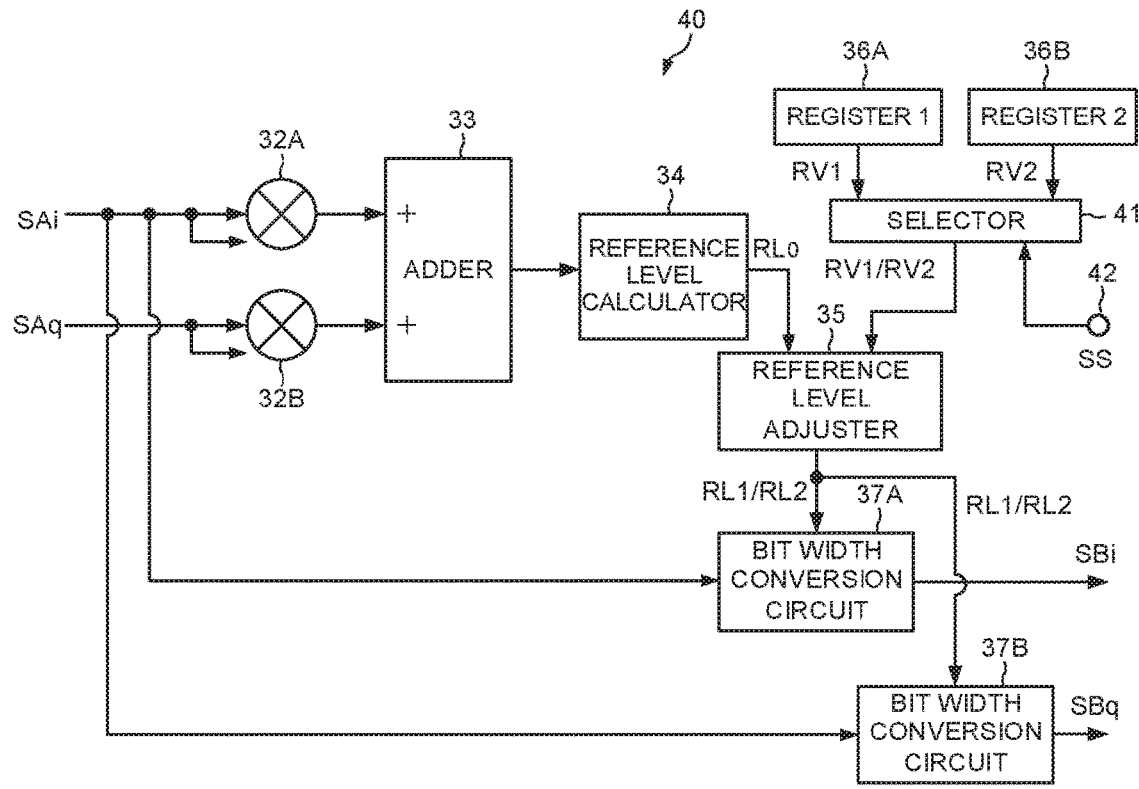
FIG. 7 is a block diagram showing an example of a configuration of an AGC circuit 40 according to a second embodiment.

FIG. 7 is a block diagram showing an example of a configuration of an AGC circuit 40 according to a second embodiment. The difference between the AGC circuit 40 and the AGC circuit 30 according to the first embodiment is that the AGC circuit 40 includes first and second registers 36A and 36B and a selector 41. The other components of the AGC circuit 40 are the same as those of the AGC circuit 30 according to the first embodiment.

As in the case of the first embodiment, the AGC circuit 40 converts m-bit width signals SAi and SAq input thereto into n-bit width signals SBi and SBq (m>n), respectively, and outputs the signals SBi and SBq. In the following description, the signals SAi and SAq each have a 10-bit width (m=10), and the signals SBi and SBq each have a 3-bit width. However, the bit widths are not limited thereto, and can take any number as long as m>n is satisfied.

The first and second registers 36A and 36B store first and second adjustment values (or setting values) RV1 and RV2, respectively, to be supplied to the selector 41. A synchronous signal SS (for example, a signal changing from an "L" level to a "H" level in a synchronous manner) obtained by a synchronization control circuit 24 of a despreading circuit 20 is input to the selector 41 through a synchronous signal reception terminal 42.

Figure 8:
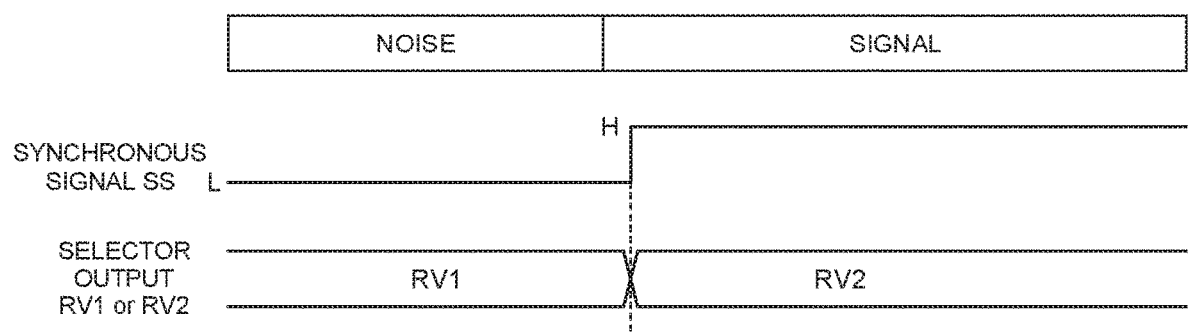
FIG. 8 is a timing chart of a synchronous signal SS and the output state of a selector 41, when switching from a signal non-receiving (or thermal noise receiving) state to a signal receiving state.

FIG. 8 schematically shows the synchronous signal SS and the output state of the selector 41, when switching from a signal non-receiving (or thermal noise receiving) state to a signal receiving state. The selector 41 switches between the output value RV1 of the first register 36A and the output value RV2 of the second register 36B in accordance with the synchronous signal SS, and outputs the selected value to a reference level adjuster 35. More specifically, in the signal non-receiving state, the selector 41 outputs the value RV1 to the reference level adjuster 35. In the signal receiving state, the selector 41 outputs the value RV2 to the reference level adjuster 35.

Figure 9A:
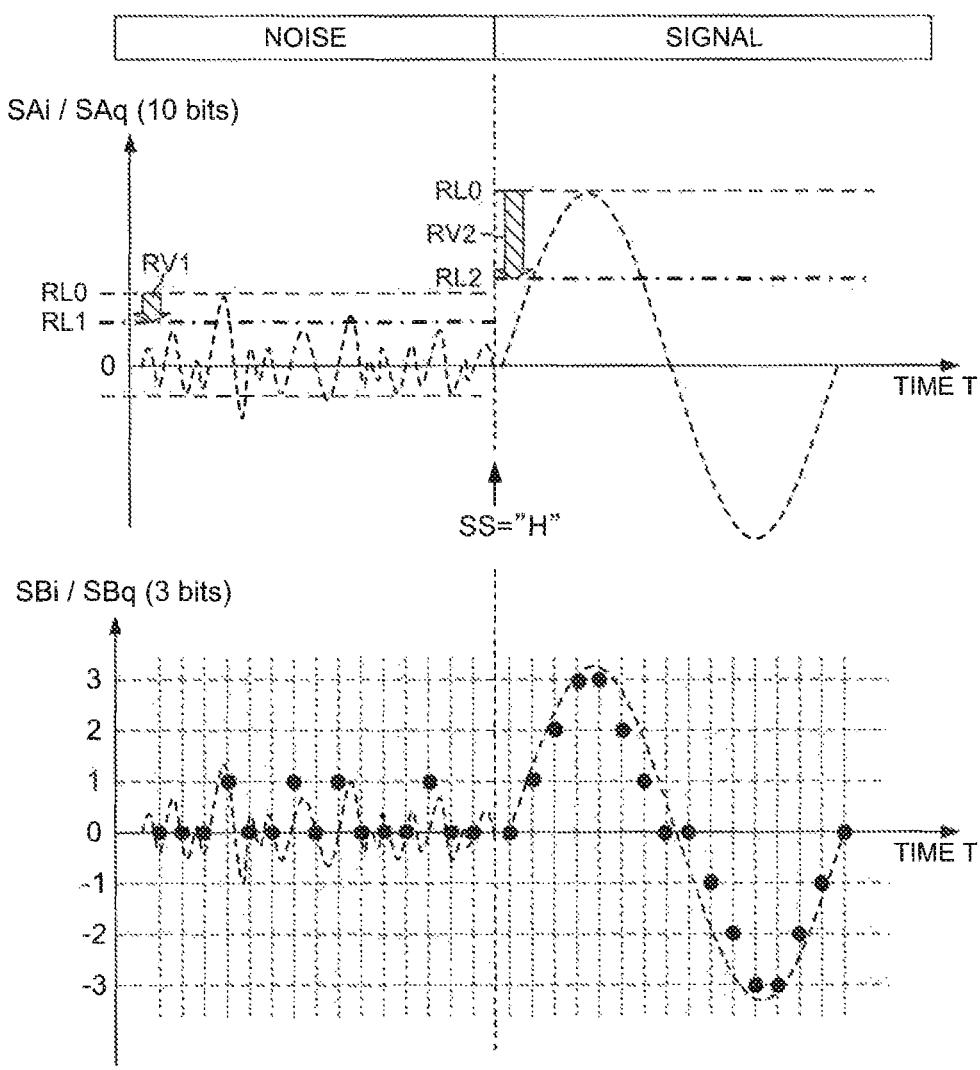
FIG. 9A is a drawing that schematically shows a case in which, upon switching of a level reduction value from RV1 to RV2 from the selector 41 in accordance with the synchronous signal SS, an adjusted reference level is switched from RL1 to RL2 (in an upper graph), and data after being subjected to a 3-bit width conversion (in a lower graph)

FIG. 9A shows, in an upper graph, a case in which upon changing a reference level RL0 calculated by a reference level calculator 34 and switching the output value (i.e. level reduction value) between RV1 and RV2 from the selector 41 in accordance with the synchronous signal SS, an adjusted reference level, which is obtained by subtracting from the reference level RL0, is switched from RL1 to RL2.

The level reduction value or subtraction value (i.e. first adjustment value) RV1 in the signal non-receiving state is set smaller than the level reduction value or subtraction value (i.e. second adjustment value) RV2 in the signal receiving state (RV1<RV2). As is plotted in a lower graph of FIG. 9A, data is converted into 3-bit width data with a high resolution, even in the signal non-receiving state.

Figure 9B:
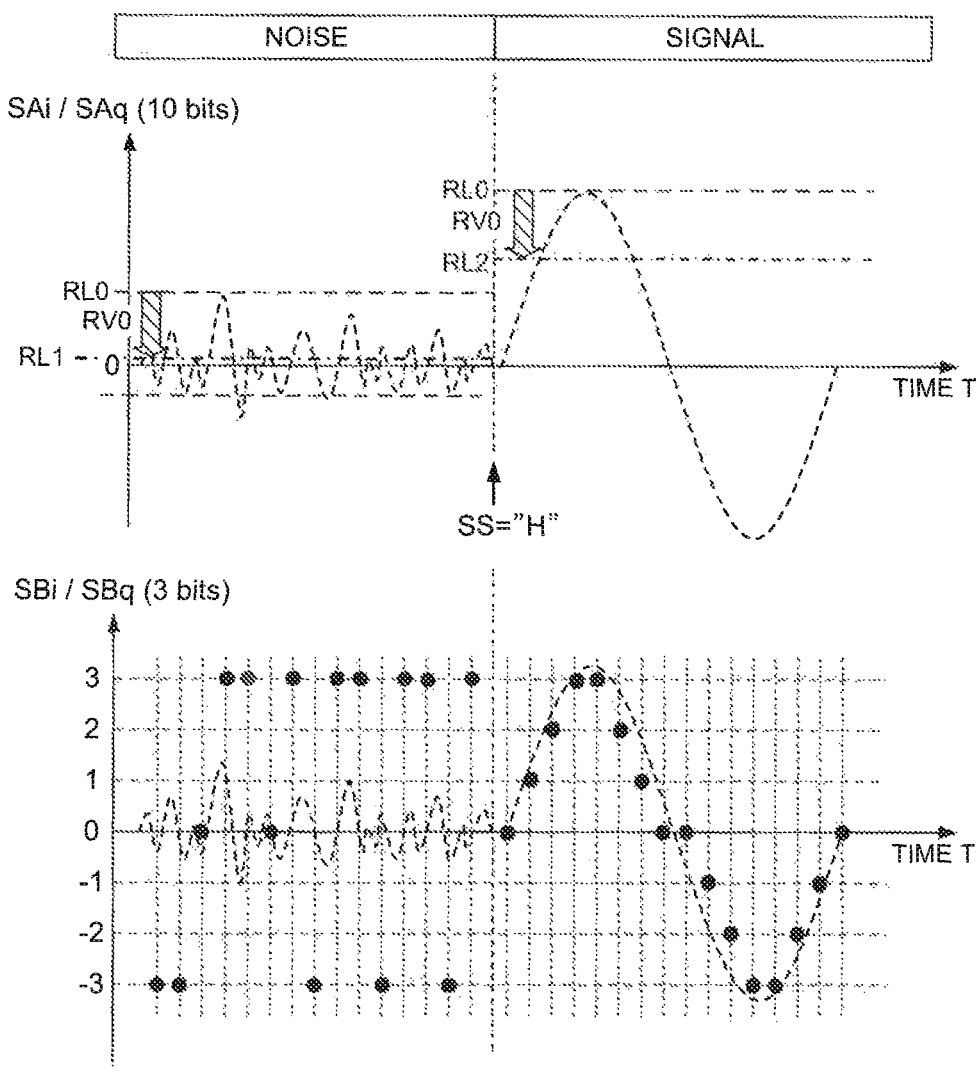
FIG. 9B is a drawing that schematically shows a case in which a level reduction value (RV0) is invariable between a signal non-receiving (or thermal noise receiving) state and a signal receiving state (in an upper graph), and the resolution of a converted signal is reduced in the signal non-receiving state (in a lower graph).

FIG. 9B schematically shows a case in which a level reduction value (RV0) is unchanged (invariable) between a signal non-receiving (or thermal noise receiving) state and a signal receiving state (in an upper graph).

The use of the reduction value (RV0) with the same reference level as that in the signal receiving state even in the signal non-receiving (or thermal noise receiving) state makes the reference level at the time of bit-width conversion significantly small, thereby reducing the resolution of the signal after conversion. FIG. 9B shows that almost all the data after the 3-bit width conversion in the signal non-receiving state are converted to three values of −3, 0, and 3 (shown in the lower graph).

In this case, even in the thermal noise receiving state, a correlation value calculated in a demodulation process (in a reception circuit in a later stage of a correlator) may exceed a correlation threshold value, and hence thermal noise may be wrongly processed as a desired signal (i.e. a wrong detection of the signal).

In this embodiment, a bit width conversion is performed using one of different reference levels (i.e. adjustment reference levels) chosen in accordance with the synchronization state (i.e. synchronous or asynchronous state). To be more specific, since different subtraction values (or reference level adjustment values) are used in the signal non-receiving state (or thermal noise receiving state) and the signal receiving state, it is possible, when receiving a desired signal, to keep the high resolution of the signal after the bit width conversion, while preventing the wrong detection of the signal, thus preventing degradation in reception performance.

In the signal non-receiving state, since the reference level RL0 before adjustment is low, setting a high reference level after the adjustment, with respect to thermal noise, allows maintaining such an amplitude resolution as to detect the thermal noise as thermal noise. In the signal receiving state, since the reference level RL0 before adjustment is high, setting a low reference level after the adjustment, with respect to a signal, allows maintaining an optimal resolution for signal processing.

In this embodiment, the first and second registers 36A and 36B are provided, and the first and second adjustment values RV1 and RV2 are stored therein, but the present invention is not limited thereto. For example, a register (or memory) for storing or holding a plurality of adjustment values may be provided. The selector 41 may select one of the adjustment values from the register, and the reference level adjuster 35 may generate an adjusted reference level on the basis of the adjustment value selected by the selector 41.

In this case, in an asynchronous state to a reception signal, a first adjustment value is selected from the adjustment values stored in the register, and an adjusted reference level is generated by subtracting the first adjustment value from a reference level. In a synchronous state to a reception signal, a second adjustment value, which is greater than the first adjustment value, is selected from the adjustment values stored in the register, and an adjusted reference level is generated by subtracting the second adjustment value from a reference level.

As described above, the adjusted reference level is not necessarily generated by the subtractor. For example, the reference level adjuster 35 may be constituted of a computing unit such as a divider or a multiplier. For example, when a multiplier is used, a reference level RL0 may be multiplied by a first adjustment value (for example, a value less than 1) as a coefficient in an asynchronous state to generate an adjusted reference level RL1, while a reference level RL0 may be multiplied by a second adjustment value (for example, a value less than 1) as a coefficient in a synchronous state (or in response to synchronization) to generate an adjusted reference level RL2. In this case, the first adjustment value (in the asynchronous state) is appropriately set smaller than the second adjustment value (in the synchronous state), so that even in the asynchronous state (in the signal non-receiving state), it is possible to perform a bit width conversion with a small quantization error and a high resolution.

According to the embodiments, as described above, the bit width conversion can be performed with the low quantization error and the high resolution in both of the asynchronous state and the synchronous state. Since the AGC circuit supplies the reception data that has been subjected to the bit width conversion with the high resolution, it is possible to provide the despreading circuit that can perform demodulation with high accuracy. It is also possible to provide a method for reproducing the reception data with the high resolution and the high accuracy.

This application is based on a Japanese Patent Application No. 2017-013354 which is hereby incorporated by reference.

What is claimed is:

1. An automatic gain control circuit for controlling a gain: of a wireless receiver in accordance with an amplitude of a reception signal, the automatic gain control circuit comprising:

a reference level calculator configured to calculate a reference level of bit width conversion based on an amplitude of the reception signal;

a register configured to store an adjustment value;

a reference level adjuster configured to adjust said reference level calculated by said reference level calculator based on the adjustment value stored in the register to generate an adjusted reference level; and a bit width conversion circuit configured to perform a bit width conversion by dividing the amplitude of the reception signal, and changing borders for the dividing of the amplitude of the reception signal in accordance with the adjustment of the reference level performed by the reference level adjuster.

2. The automatic gain control circuit according to claim 1, further comprising:

a synchronous signal reception terminal configured to receive a synchronous signal of the reception signal; and a selector, wherein the register stores a plurality of adjustment values for the reference level, and the selector selects one of the adjustment values from the register in accordance with the synchronous signal, and the reference level adjuster generates the adjusted reference level based on the one of the adjustment values.

3. The automatic gain control circuit according to claim 1, wherein the reference level adjuster subtracts the adjustment value from the reference level to generate the adjusted reference level.

4. The automatic gain control circuit according to claim 2, wherein the reference level adjuster has a subtractor configured to subtract the adjustment value from the reference level to generate the adjusted reference level, and in an asynchronous state to the reception signal, a first adjustment value is selected from the register and supplied to the subtractor, and in response to the synchronous signal, a second adjustment value greater than the first adjustment value is selected from the register and supplied to the subtractor.

5. A de-spreading circuit comprising: an automatic gain control circuit comprising:

a reference level calculator configured to calculate a reference level of bit width conversion based on an amplitude of a reception signal;

a register configured to store an adjustment value;

a reference level adjuster configured to adjust said reference level calculated by said reference level calculator based on the adjustment value stored in the register to generate an adjusted reference level lower than the reference level;

a bit width conversion circuit configured to perform a bit width conversion by dividing the amplitude of the reception signal and changing borders for the dividing of the amplitude of the reception signal in accordance with the adjustment of the reference level performed by the reference level adjuster;

a correlator configured to generate a correlation value signal representing a correlation value between a bit width converted signal whose bit width has been converted by the bit width conversion circuit and a spreading sequence;

a comparison circuit configured to perform a comparison between the correlation value and a threshold value, to generate a comparison signal representing a compari-son result; a synchronization control circuit configured to generate a synchronous signal based on the comparison signal; and a symbol timing generation circuit configured to generate a symbol timing signal representing a symbol timing and a reception clock based on the synchronous signal and the comparison signal; and a data reproduction circuit configured to generate reception data based on the correlation value signal and the symbol timing signal.

6. The despreading circuit according to claim 5, wherein the register stores a plurality of adjustment values for the reference level, and selects one of the plurality of adjustment values from the register in accordance with the synchronous signal from the synchronization control circuit.

7. A method for reproducing reception data comprising:

calculating a reference eve of bit width conversion based on an amplitude of a reception signal;

holding a plurality of adjustment values for the calculated reference level;

receiving a synchronous signal of the reception signal;

in an asynchronous state to the reception signal, selecting a first adjustment value from the adjustment values, and generating an adjusted reference level by subtracting the first adjustment value from the calculated reference level;

in a synchronous state to the reception signal in response to the synchronous signal, selecting a second adjustment value greater than the first adjustment value from the adjustment values, and generating an adjusted reference level by subtracting the second adjustment value from the calculated reference level;

performing a bit width conversion by dividing the amplitude of the reception signal, and changing borders for the dividing of the amplitude of the reception signal in accordance with the adjustment of the reference level, to generate a bit width converted signal; generating a correlation value signal representing a correlation value between the bit width converted signal and a spreading sequence;

making a comparison between the correlation value and a threshold value, to generate a comparison signal representing a comparison result;

generating a synchronous signal based on the comparison signal; generating a symbol timing signal representing a symbol timing and a reception clock based on the synchronous and the comparison signal; and generating the reception data based on the correlation value signal and the symbol timing signal.

8. An automatic gain control circuit for controlling a gain of a wireless receiver in accordance with an amplitude of a reception signal, the automatic gain control circuit comprising:

a reference level calculator configured to calculate a reference level of bit width conversion based on a summation signal which is obtained by summing up a square of an amplitude of an in-phase signal of reception signal and the square of an amplitude, of a quadrature signal of the reception signal;

a register configured to store an adjustment value;

a reference level adjuster configured to adjust said reference level calculated by said reference level calculator based on the adjustment value stored in the register to generate an adjusted reference level; and a bit width conversion circuit configured to perform a bit width conversion by dividing the amplitude of the reception signal in accordance with said reference level adjusted by the reference level adjuster.

\* \* \* \* \*